(12) United States Patent
Lin et al.

(10) Patent No.: US 11,846,022 B2
(45) Date of Patent: Dec. 19, 2023

(54) THIN-FILM-DEPOSITION MACHINE

(71) Applicant: SKY TECH INC., Hsinchu County (TW)

(72) Inventors: Jing-Cheng Lin, Hsinchu County (TW); Ta-Hao Kuo, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 193 days.

(21) Appl. No.: 17/569,236

(22) Filed: Jan. 5, 2022

(65) Prior Publication Data

US 2023/0212745 A1    Jul. 6, 2023

(51) Int. Cl.
*C23C 16/455* (2006.01)
*C23C 16/52* (2006.01)

(52) U.S. Cl.
CPC ........ *C23C 16/45544* (2013.01); *C23C 16/52* (2013.01)

(58) Field of Classification Search
CPC .......... C23C 16/45544; C23C 16/4586; C23C 16/4412
See application file for complete search history.

(56) References Cited

U.S. PATENT DOCUMENTS

2012/0009765 A1\* 1/2012 Olgado ............ C23C 16/45565
257/E21.09

\* cited by examiner

*Primary Examiner* — Joseph A Miller, Jr.
(74) *Attorney, Agent, or Firm* — Chun-Ming Shih; HDLS IPR SERVICES

(57) ABSTRACT

A thin-film-deposition machine includes a chamber, a carrier, an extraction ring and a dispensing unit. The chamber includes a containing space and an extraction channel disposed around the containing space. The extraction channel is partitioned into a first, a second and a third channel areas. The carrier is disposed within the containing space. The first channel area is connected to the third channel area via the second channel area. The third channel area is formed with a height greater than that of the first channel area. The extraction ring includes a plurality of extraction holes and a ring channel. The extraction holes are disposed around the carrier for extracting gas from the containing space to the extraction channel, sequentially via the extraction holes, the ring channel. Thereby an even and steady flow field can be formed above the carrier and the thickness uniformity of film deposition can be improved.

18 Claims, 12 Drawing Sheets

THIN-FILM-DEPOSITION MACHINE

TECHNICAL FIELD

The present disclosure relates to a thin-film-deposition machine, which can facilitate to create steady flow field of gas above wafer, thereby to facilitate forming thin film on the wafer with evenly-distributed thickness.

BACKGROUND

As integral-circuit technology develops and evolves, electronic products become smaller, along with high performance, reliability and intelligence. Therefore, micro-sizing transistors within electronic is a significant technique, which can reduce current-passing duration and energy loss for boosting calculation and power saving, along with the sizing-down transistors.

Atomic-layer deposition (ALD) is a technical process for coating substances with atomic size on a wafer (or substrate), layer by layer. The ALD method mainly employs two different types of chemical substance so-called "precursors", and transfers the two precursors in sequential manner to react during the process.

To be more specific, the ALD process is first to transfer a first precursor into a reaction chamber, and guide, feed the first precursor onto surface of the wafer to start chemisorption therewith until achieving saturation, and then stop the feeding of the first precursor. On next, to transfer a cleaning gas into the reaction chamber for flushing out the residual first precursor. Thereafter, to transfer a second precursor into the reaction chamber, and guide, feed the second precursor onto the surface of the wafer which is coated with a thin film made of the first precursor, to start another chemisorption therewith until achieving saturation, then once again to transfer a cleaning gas into the reaction chamber for flushing out the residual second precursor. Such that, to repeat feeding in and flushing out different types of precursor, it is able to form and construct multiple layers of thin film on the wafer.

It should be noted that during a practical process, distribution evenness of thin film might vary greatly due to certain factors, such as how the precursor spreads, or temperature distribution of the wafer, etc. Therefore, many ALD machine makers have been dedicated to improve dispensing mechanism of precursor, for a better quality of production.

SUMMARY

As described in background, the conventional thin-film-deposition machines have difficulties of distributing precursor evenly on the wafer, therefore to result in an undesired quality of thin film on the wafer. Thus, the present disclosure provides a new thin-film-deposition machine, which can create and form a steady and even flow field of precursor above the wafer and a carrier for carrying the wafer, in order to form a thin film on the wafer with evenly-distributed thickness.

An object of the present disclosure is to provide a thin-film-deposition machine, which mainly includes a chamber, a carrier, an extraction ring and a dispensing unit. The chamber includes a containing space and an extraction channel. The extraction channel is formed annular and disposed around the containing space of the chamber. The extraction ring includes a plurality of extraction holes and a ring channel connected to each other, and thereby the containing space is connected to extraction channel sequentially via the extraction hole and the ring channel.

In one embodiment, a plurality of extraction holes may be evenly disposed around the carrier. The extraction channel includes a first channel area, a second channel area and a third channel area. The third channel area has a height greater than that of the first channel area; and the third channel area is connected to the first channel area via the second channel area. The second channel area formed larger at side of the third channel area and tapers toward the first channel area, so as to facilitate transferring gas from the first channel area to the third channel area through the second channel area.

According to the present disclosure, by virtue of the extraction channel and the extraction ring, it is able to facilitate extracting, flushing the gas out of the containing space, so as to create an even and steady flow field above the wafer carried by the carrier, and thereby to form a thin film on surface of the wafer with an evenly-distributed thickness.

In another embodiment according to the present disclosure, the ring channel of the extraction ring is connected to the extraction channel via a plurality of connecting holes, wherein a distribution density or diameters of the extraction holes and/or the connecting holes are adjustable in accordance with a structure of the extraction channel.

Specifically, the extraction holes and/or the connecting holes above the first channel area may be disposed with a distribution density or diameters greater or larger than that of those extraction holes and/or the connecting holes above the second channel area. In the other hand, the extraction holes and/or the connecting holes above the second channel area may be disposed with a distribution density or diameters greater or larger than that of those extraction holes and/or the connecting holes above the third channel area. Thereby, the gas or precursor within the containing space above the surface of the wafer diffuse substantially in a radially-outward manner from the carrier and flows into the extraction holes around the carrier, so as to create an even and steady flow field above the surface of the wafer.

To achieve the abovementioned object, the present disclosure provides a thin-film-deposition machine, which includes a chamber, a carrier, an extraction ring and a dispensing unit. The chamber includes a containing space and an extraction channel disposed around the containing space, wherein the extraction channel includes a first channel area, a second channel area and a third channel area; the first channel area is formed with a first height less than a third height of the third channel area; and the second channel area is disposed between the first channel area and the third channel area, and is formed with a second height that becomes greater from side of the first channel area to side of the third channel area. The carrier disposed within the containing space and includes a carrying surface for carrying at least one wafer thereon. The extraction ring includes an annular-external wall; an annular-internal wall surrounded by the annular-external wall and surrounding the carrier, wherein the annular-external wall and the annular-internal wall have a ring channel are fluidly connected to the extraction channel of the chamber; the extraction ring is also formed with a plurality of extraction holes that is on the annular-internal wall, that is fluidly connected to the ring channel and the containing space, and that is disposed around the carrier; and a dispensing unit includes a dispensing surface facing the carrying surface of the carrier, and is formed with a plurality of inlet holes disposed on the dispensing surface and fluidly connected to the containing space of the chamber.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
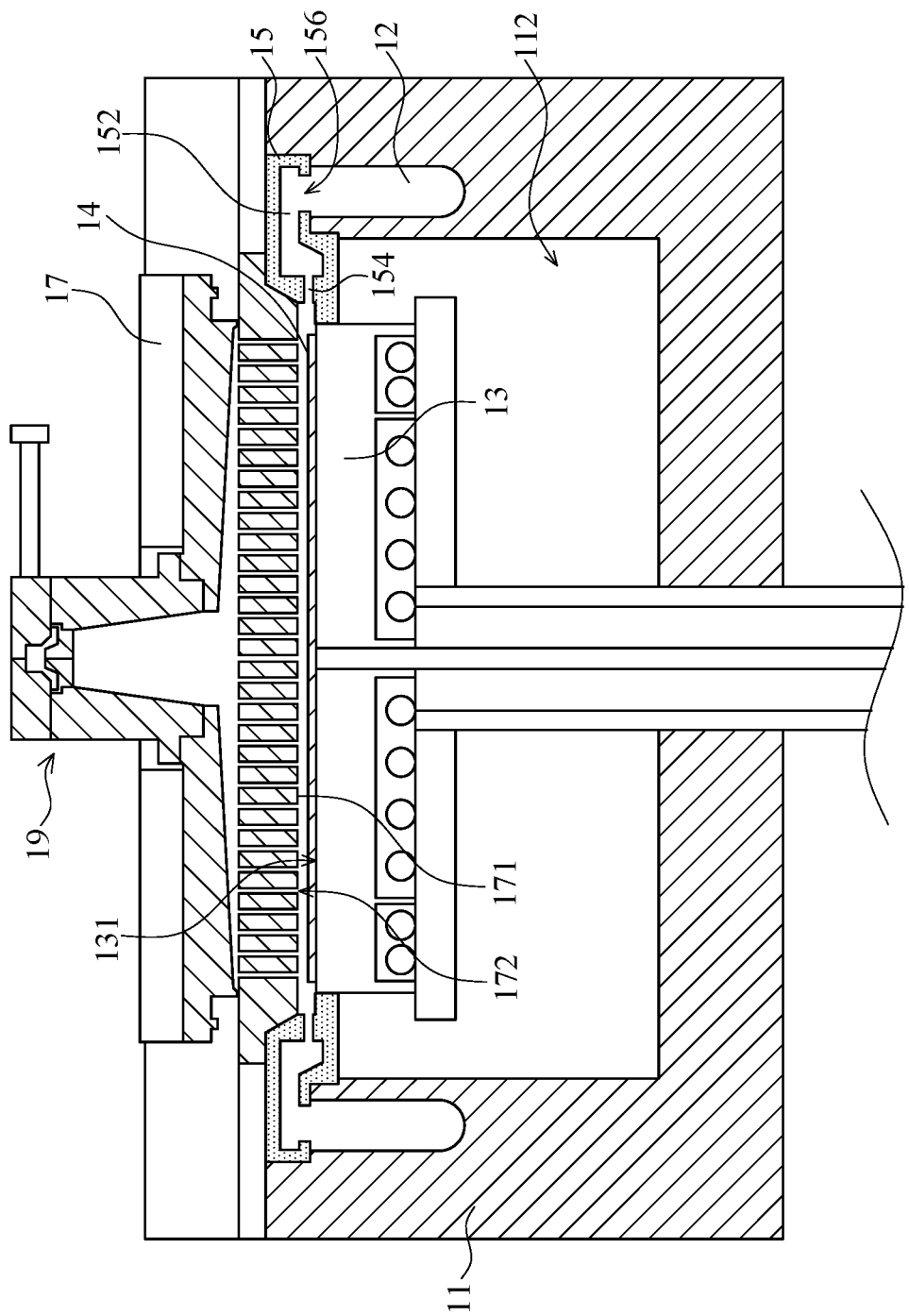
FIG. 1 is a cross-sectional view illustrating a thin-film-deposition machine, according to one embodiment of the present disclosure.
Figure 2:
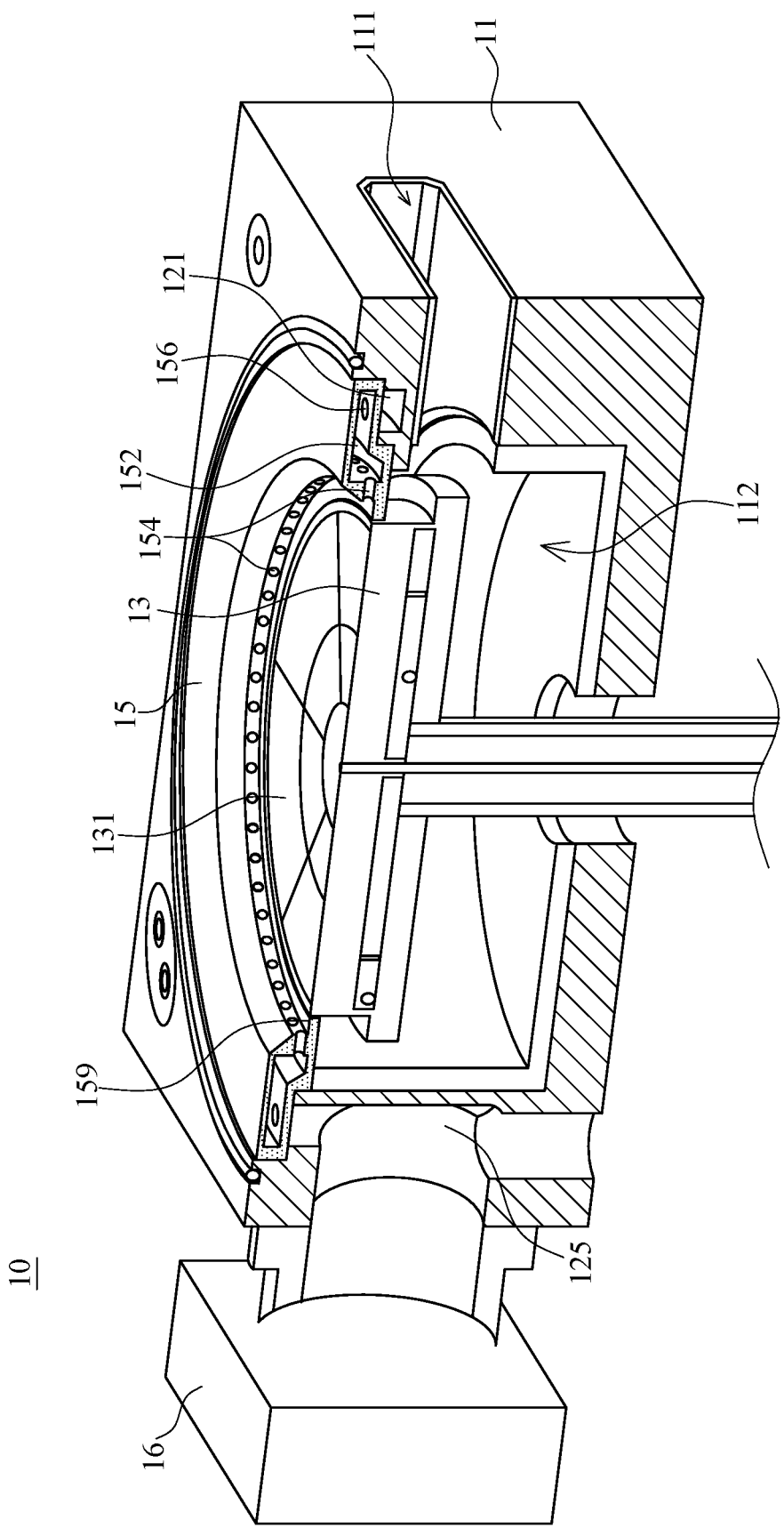
FIG. 2 is a perspective cross-sectional view illustrating the thin-film-deposition machine, according to one embodiment of the present disclosure.

Referring to FIG. 1 and FIG. 2, wherein FIG. 1 is a cross-sectional view illustrating a thin-film-deposition machine, and FIG. 2 is a perspective cross-sectional view illustrating the thin-film-deposition machine, according to one embodiment of the present disclosure. As shown in the FIGs, the thin-film-deposition machine 10 mainly includes a chamber 11, a carrier 13, an extraction ring 15 and a dispensing unit 17. The chamber 11 includes a containing space 112 and an extraction channel 12 disposed around the containing space 112. The carrier 13 is disposed within the containing space 112, and the carrier 13 includes a carrying surface 131 for carrying at least one wafer 14.

In one embodiment of the present disclosure, the containing space 112 of the chamber 11 is proximately cylindrical, while the extraction channel 12 is a circular trench around the containing space 112. In a different embodiment, the containing space 112 may be formed polygonal, and the extraction channel 12 may also be a trench with polygonal and closed loop.

Figure 3:
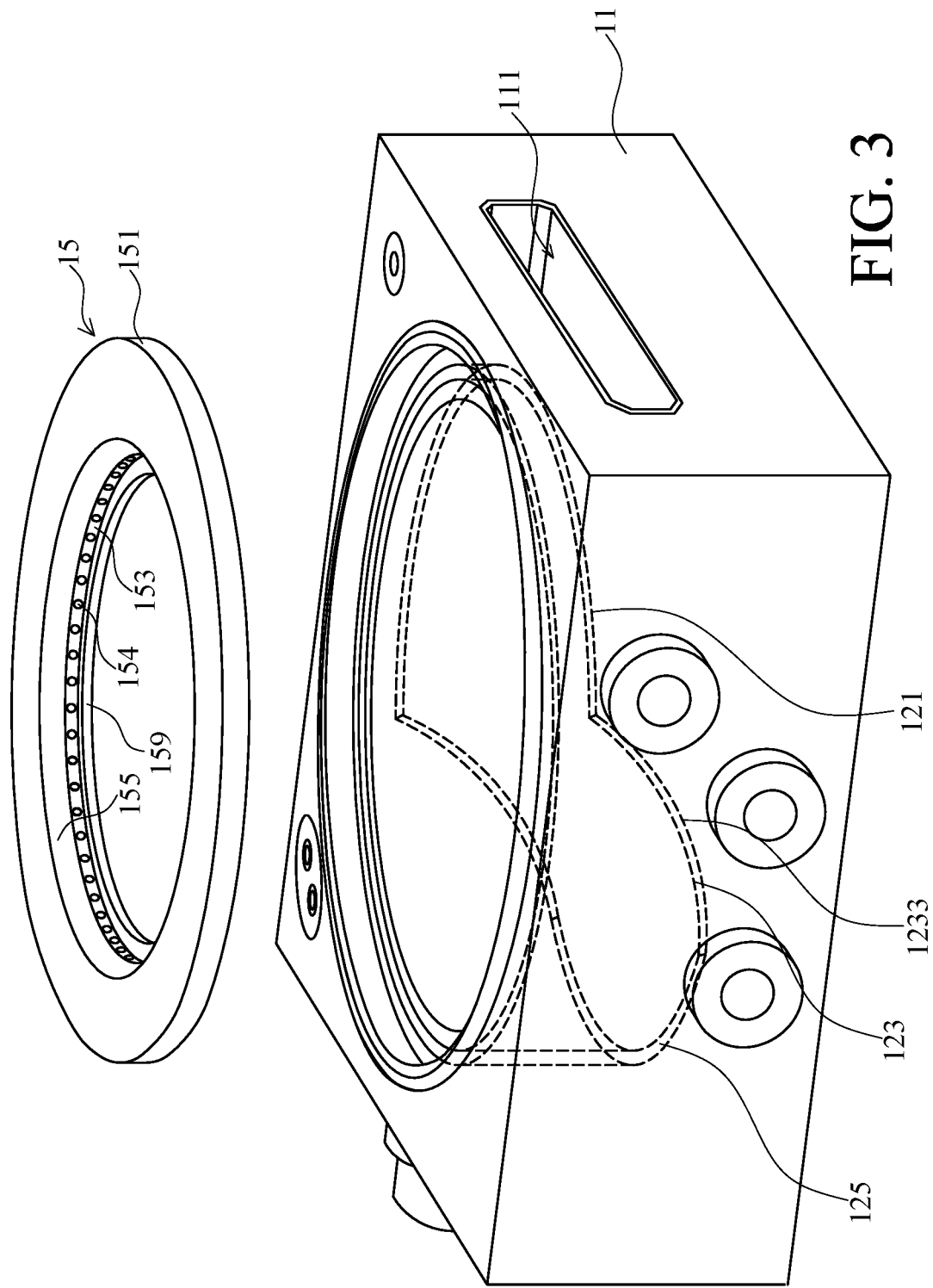
FIG. 3 is a perspective exploded view illustrating the thin-film-deposition machine, according to one embodiment of the present disclosure.
Figure 4:
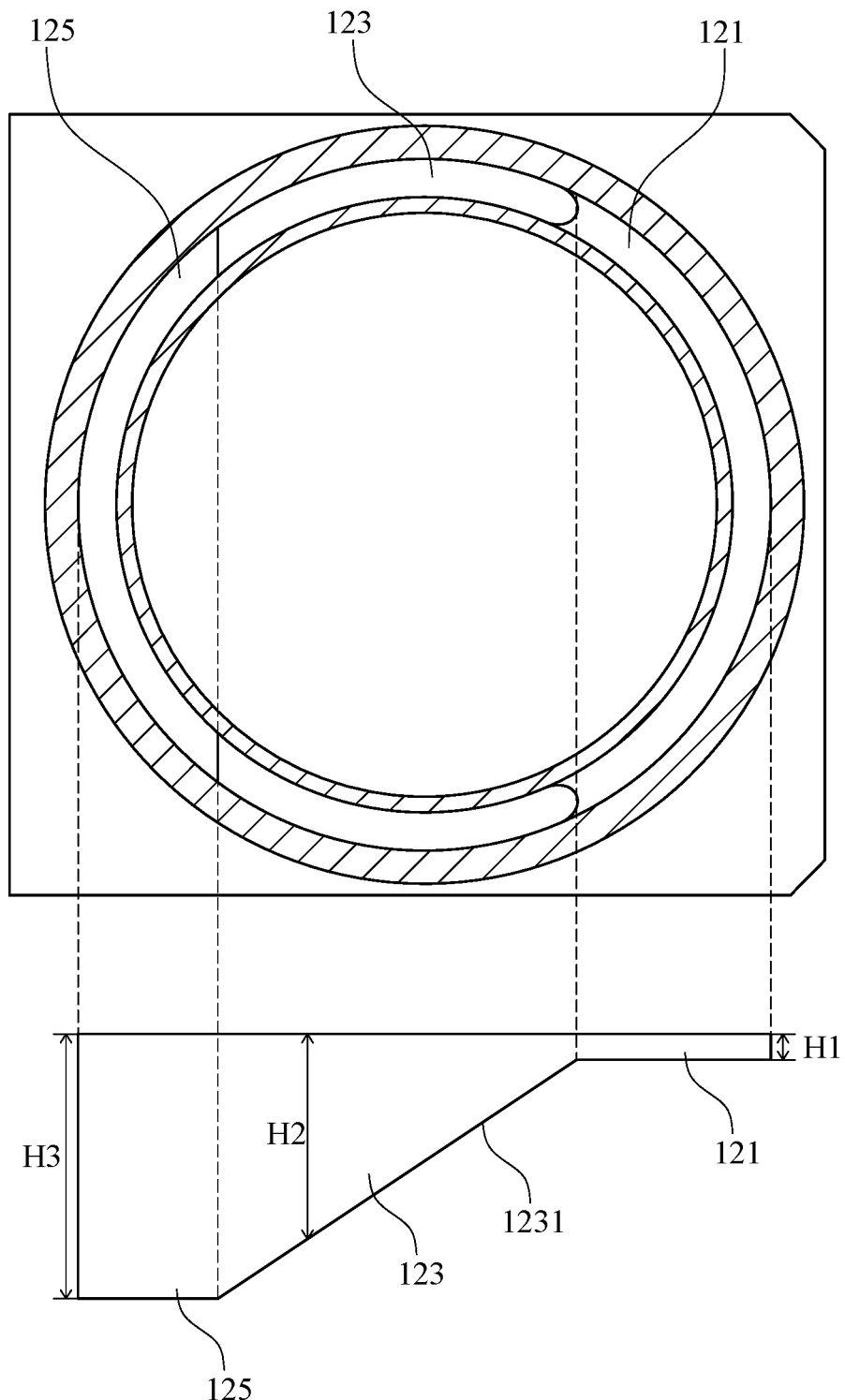
FIG. 4 is a top view and a cross-sectional view illustrating the thin-film-deposition machine, according to one embodiment of the present disclosure.

As shown in FIG. 3 and FIG. 4, the extraction channel 12 includes a first channel area 121, a second channel area 123 and a third channel area 125. In more detail, the first channel area 121 is a portion of the extraction channel 12 formed with a first height H1, the second channel area 123 is a portion of the extraction channel 12 formed with a second height H2, and then the third channel area 125 is a portion of the extraction channel 12 formed with a third height H3. The first channel area 121 is spatially and fluidly connected to the third channel area 125 through the second channel area 123, thereby to define the annular extraction channel 12 together.

The first height H1 of the first channel area 121 is shorter than the third height H3 of the third channel area 125. The second height H2 of the second channel area 123 is formed in a range between the first height H1 and the third height H3, specifically, the second height H2 is formed shorter at a side corresponding to the first channel area 121, and becomes greater toward a side corresponding to the third channel area 125. In more detail, the tapered second channel area 123 is defined by an inclined surface 1231 (such as embodiment of FIG. 4) or a curved surface 1233 (such as embodiment of FIG. 3), wherein the inclined surface 1231 or a curved surface 1233 is at a bottom of second channel area 123, which also interconnects bottoms of the first channel area 121 and the third channel area 125.

As shown in FIG. 1, the dispensing unit 17 includes a dispensing surface 171 disposed with a plurality of inlet holes 172. When the dispensing unit 17 is mounted and connected to the chamber 11, the dispensing surface 171 and the inlet holes 172 thereon is configured to face the carrying surface 131 of the carrier 13 and/or the wafer 14 carried thereon. The inlet holes 172 of the dispensing unit 17 are fluidly connected to the containing space 112, for transferring a gas or precursor to an upside of the wafer 14.

Figure 5:
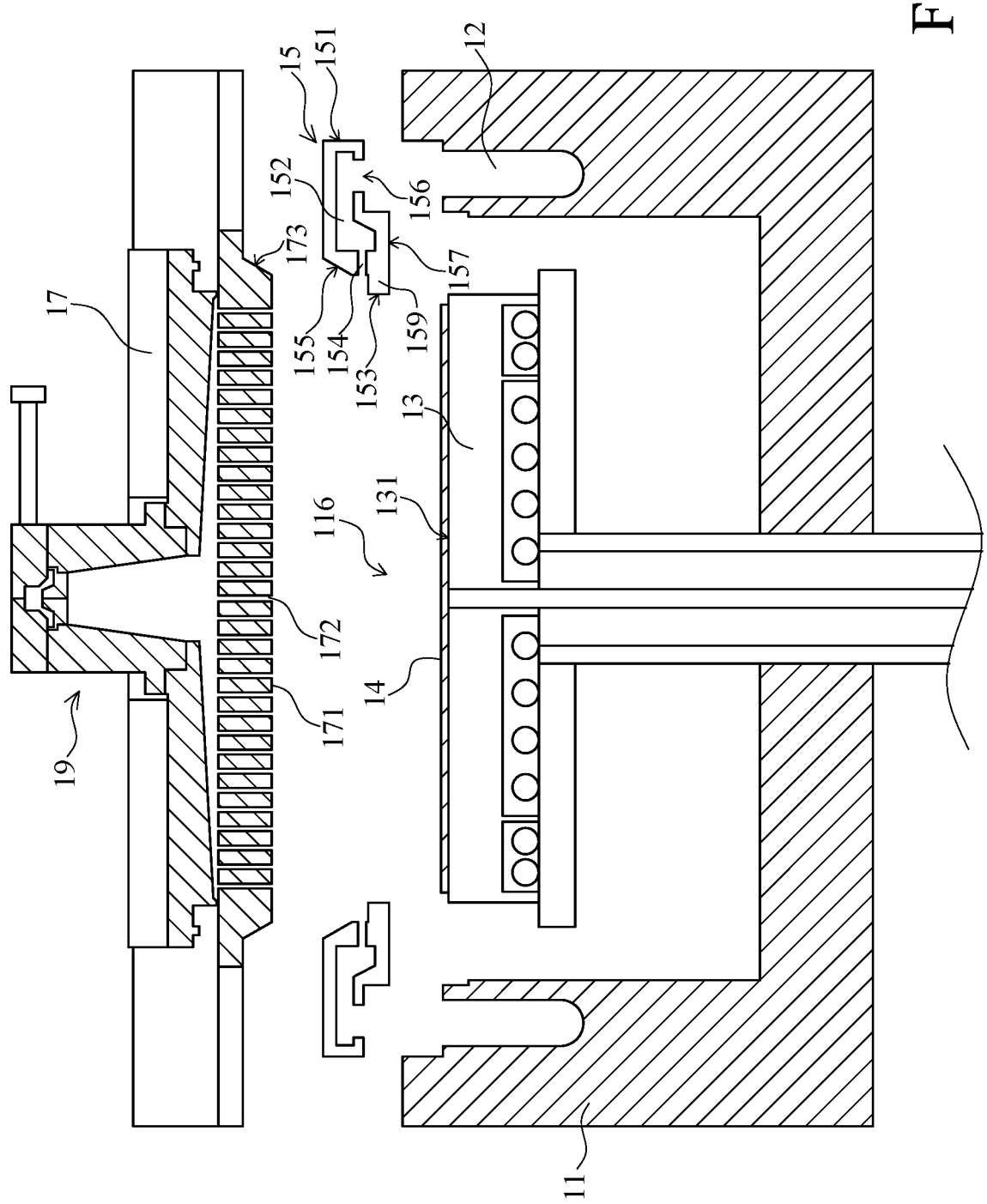
FIG. 5 is a cross-sectional view illustrating the thin-film-deposition machine, according to one embodiment of the present disclosure.

Referring to FIG. 5, the extraction ring 15 is annular, and includes an annular-external wall 151 and an annular-internal wall 153. The annular-internal wall 153 is disposed radially inner than the annular-external wall 151, such that the annular-external wall 151 and the annular-internal wall 153 together define a ring channel 152 therebetween. The annular-external wall 151 may be a relatively large ring, whereas the annular-internal wall 153 is a relatively small ring.

The annular-internal wall 153 is disposed around the carrying surface 131 of the carrier 13. The annular-internal wall 153 is provided with a plurality of extraction holes 154 which fluidly interconnect the ring channel 152 and the containing space 112 within the chamber 11. To be more specific, when performing a deposition process to the wafer 14 carried by the carrier 13, the extraction hole 154 of the extraction ring 15 are configured to surround the carrying surface 131 of the carrier 13 and/or the wafer 14 thereon.

As shown in FIG. 1, the gas or precursor from the dispensing unit 17 is transferred into the containing space 112, and then extracted out of the containing space 112 from the extraction holes 154 of the extraction ring 15. During the process, the gas or precursor is first sent onto the carrying surface 131 of the carrier 13 and/or a top surface of the wafer 14, then to diffuse radially-outward from the carrying surface 131 into the extraction holes 154. Therefore, the thin-film-deposition machine 10 is able to create an even and steady flow field on the carrying surface 131 or the top surface of the wafer 14, in order to form a thin film with an evenly-distributed thickness. More to mention, the extraction holes 154 may be disposed higher than the carrying surface 131 of the carrier 13, or disposed substantially on same height level as the top surface of the wafer 14, during the process.

As shown in FIG. 5, the extraction ring 15 is disposed between the dispensing unit 17 and the chamber 11. Furthermore, in one embodiment of the present disclosure, the extraction ring 15 may include a first annular bevel 155. The first annular bevel 155 is formed on a radially-internal side of the annular-internal wall 153. The first annular bevel 155 inclines with respect to an axis of the annular-internal wall 153 and/or the carrier 13, and faces the dispensing unit 17. On the other side, the dispensing unit 17 may include a second annular bevel 173. The second annular bevel 173 is disposed around and connected to the dispensing surface 171, and the second annular bevel 173 also correspondingly faces the first annular bevel 155 of the extraction ring 15. Furthermore, both of the first and second annular bevels 155, 173 are configured to have substantially identical inclined angle, so as to align the dispensing unit 17 with the extraction ring 15, also to ensure a tight engagement therebetween.

Again, as shown in in FIG. 5, the extraction ring 15 may include an inner flange 159. The inner flange protrudes from the annular-internal wall 153 and toward the radially-internal side thereof. The inner flange 159 is disposed beneath the extraction holes 154. With such an arrangement, when the carrier 13 is driven to approach the dispensing unit 17, the carrier 13 has a lateral surface thereof adjacent to and surrounded by the inner flange 159 of the extraction ring 15, and the gas or precursor (from the dispensing unit 17) transferred onto the wafer 14 and/or the carrying surface 131 can be guided to the extraction holes 154 by the inner flange 159.

Moreover, the extraction ring 15 may have a bottom portion 157 interconnecting the annular-external wall 151 and the annular-internal wall 153, so as to define the ring channel 152 together. The bottom portion 157 is provided with one or more connecting holes 156. When the extraction ring 15 is mounted in the chamber 11, the connecting hole(s) 156 is(are) positioned corresponding to the extraction channel 12 of the chamber 11, thereby to spatially and fluidly interconnect the ring channel 152 and the extraction channel 12.

More to mention that, the connecting hole 156 may be plural disposed in a circular manner, or may be one fully or partially circular slot-hole. In one embodiment of the present disclosure, the extraction holes 154 may be disposed evenly on the annular-internal wall 153, while the connecting holes 156 are evenly disposed on the bottom portion 157.

As shown in FIG. 2 and FIG. 5, in a different embodiment of the present disclosure, according to structure of the extraction channel 12 of the chamber 11, diameters or distribution density of the extraction holes 154 and/or the connecting holes 156 may be adjusted, in order to change the flow field on the carrying surface 131 of the carrier 13 and/or the top surface of the wafer 14. For example, each of the extraction holes 154 and/or the connecting holes 156 above the first channel area 121 may be formed with diameters larger than that of each of those extraction holes 154 and/or connecting holes 156 above the third channel area 125; otherwise, the extraction holes 154 and/or the connecting holes 156 above the first channel area 121 may be disposed with a distribution density greater than that of those extraction holes 154 and/or connecting holes 156 above the third channel area 125. As for those extraction holes 154 and/or connecting holes 156 above the second channel area 123, those are formed with diameters or distribution density between that of the first channel area 121 and the third channel area 125, and more specifically, relatively large diameters or great distribution density at side of the first channel area 121, and relatively small diameters or less distribution density at side of the third channel area 125.

Moreover, each two adjacent extraction holes 154 and/or connecting holes 156 disposed above the first channel area 121, which have a distance less than that of those disposed above the third channel area 125. However, the abovementioned configuration of the extraction holes 154 and/or the connecting holes 156 is merely one embodiment, claim scope of the present disclosure is not limited thereto.

The extraction holes 154, the ring channel 152, the connecting holes 156 of the extraction ring 15, and the extraction channel 12 of the chamber 11 are fluidly connected together in sequence, and hence to define an extraction path for the gas or precursor to pass and flow out. With such extraction channel 12, the thin-film-deposition machine 10 can facilitate not only to create even and steady flow field on the wafer 14, but also to facilitate arranging pipelines. To be specific, a gas-extraction pump 16 may be fluidly connected to the third channel area 125 by the extraction channel 12 to empower the gas or precursor extraction. A wafer passage 111 may be disposed beneath the relatively narrow first channel area 121 and be connected to the containing space 112, for transporting the wafer 14 in or out of the containing space 112.

As shown in FIG. 1, the dispensing unit 17 is further fluidly connected to a transfer pipe 19. The transfer pipe 19 is for injecting the gas or precursor into dispensing unit 17, and then the dispensing unit 17 spreads the gas or precursor into the containing space 112 of the chamber 11 by the inlet holes 172.

Figure 6:
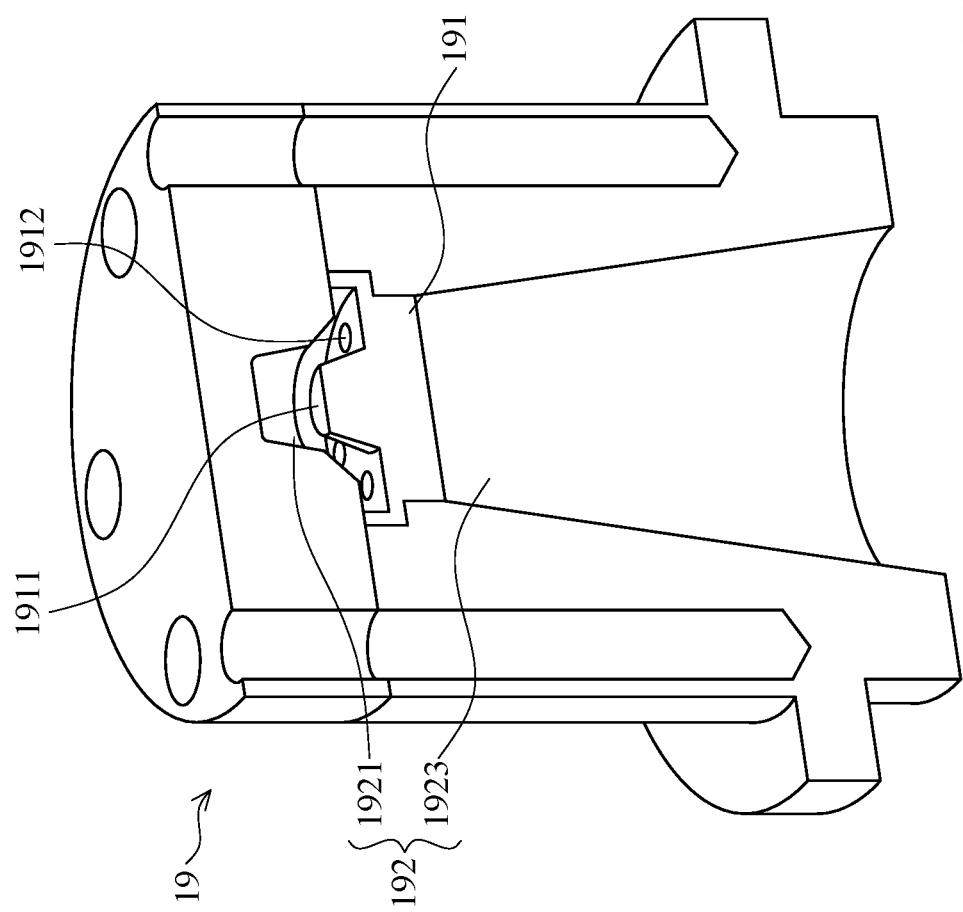
FIG. 6 is a perspective cross-sectional view illustrating a transfer pipe of the thin-film-deposition machine, according to one embodiment of the present disclosure.

As shown in FIG. 6, the transfer pipe 19 includes a transfer space 192 for transferring the gas or precursor, and the transfer pipe 19 is provided with a guide unit 191 within the transfer space 192. In more detail, the guide unit 191 divides, partitions the transfer space 192 into a first transfer space 1921 and a second transfer space 1923. The second transfer space 1923 is fluidly connected to the dispensing unit 17. The guide unit 191 includes a plurality of through holes 1912, and the through holes 1912 fluidly interconnect the first transfer space 1921 and the second transfer space 1923.

Furthermore, the guide unit 191 may have a protrusion 1911 disposed on a surface facing the first transfer space 1921. The through holes 1912 are disposed to surround the protrusion 1911, and disposed in an inclined manner with respect to the surface facing the first transfer space 1921. In practical use, gas or plasma can be transferred into the first transfer space 1921 of the transfer pipe 19, then begins to flow in a spiral manner about the protrusion 1911, thereafter to enter the second transfer space 1923 via the through holes 1912, thereby to form a vortex of within the second transfer space 1923 which whirls about an axis of transfer pipe 19.

Figure 7:
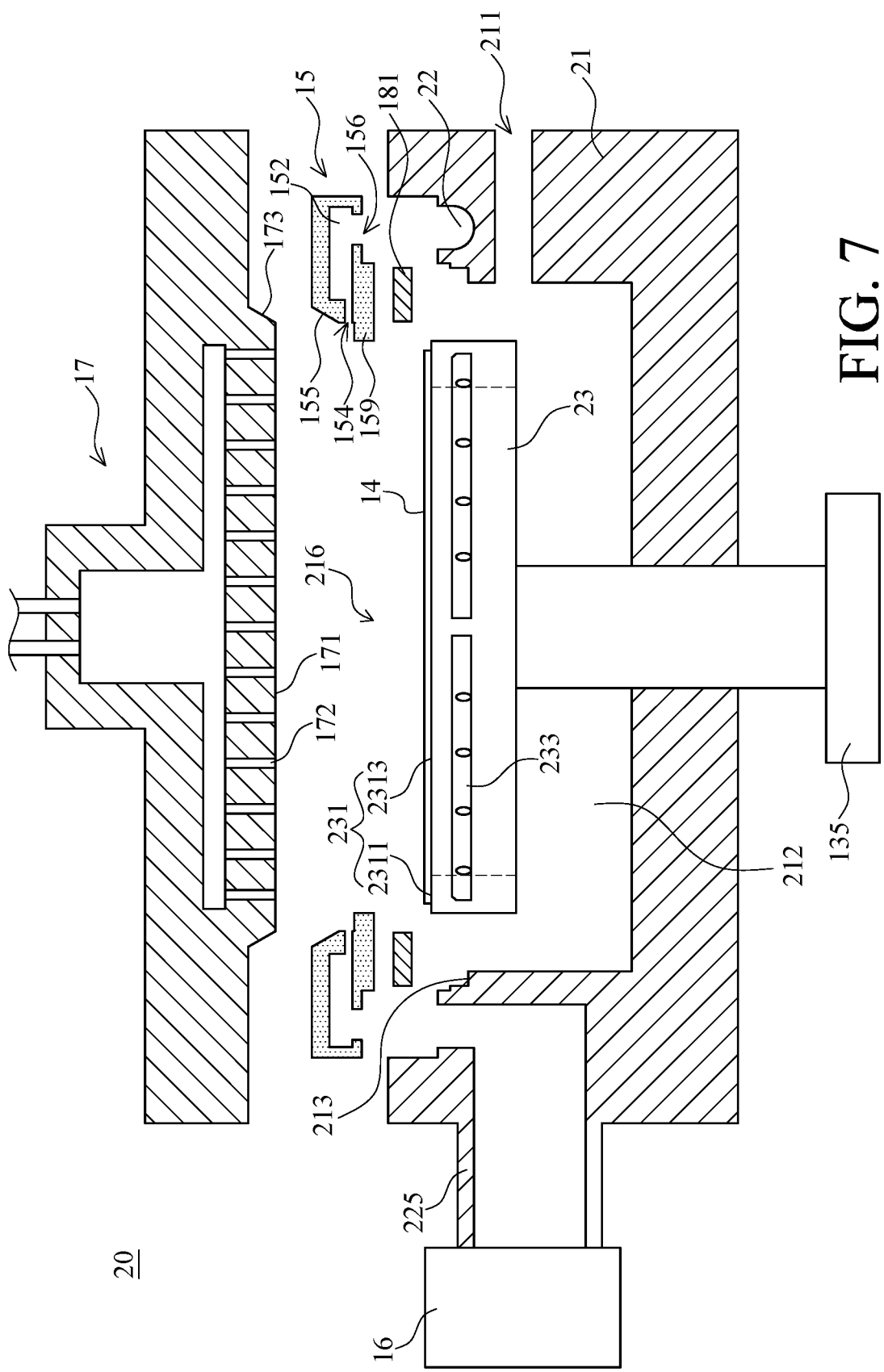
FIG. 7 is a cross-sectional view illustrating the thin-film-deposition machine, according to another embodiment of the present disclosure.
Figure 8:
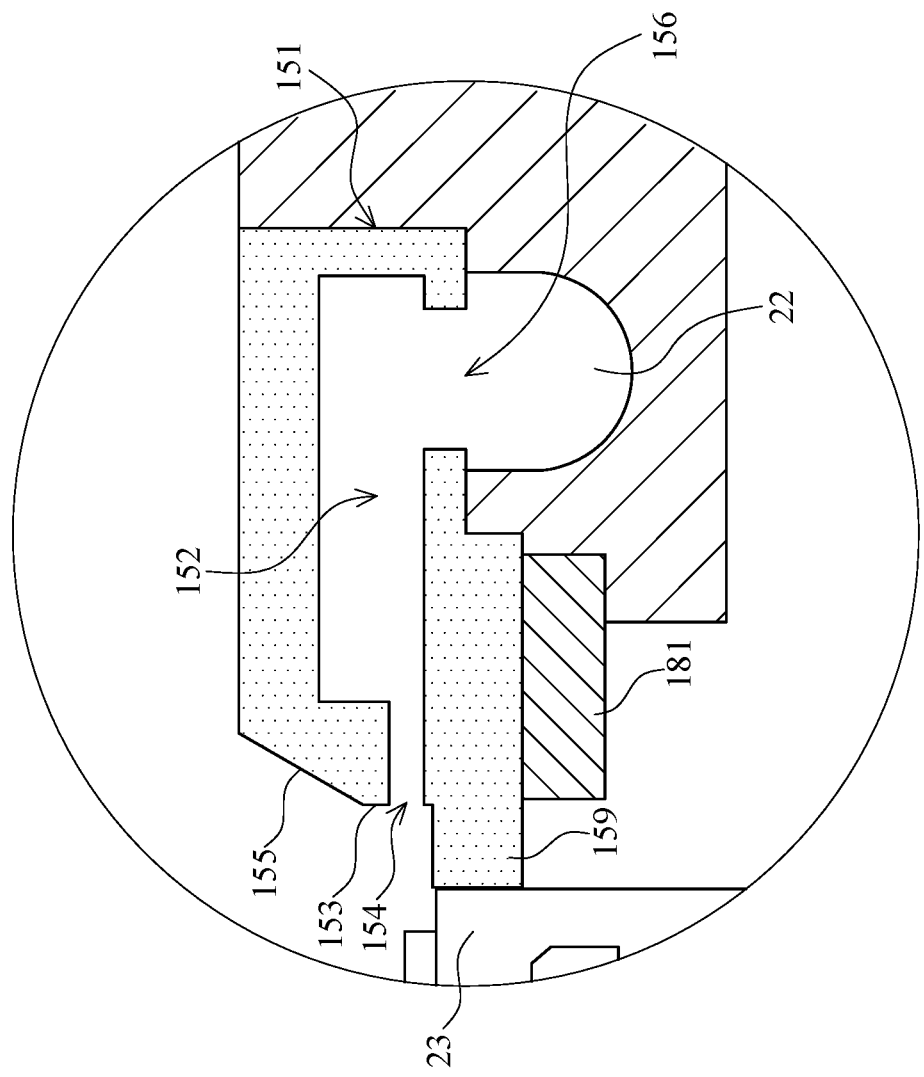
FIG. 8 is a fragmentary cross-sectional view illustrating an extraction ring and a heat ring of the thin-film-deposition machine, according to another embodiment of the present disclosure.
Figure 9:
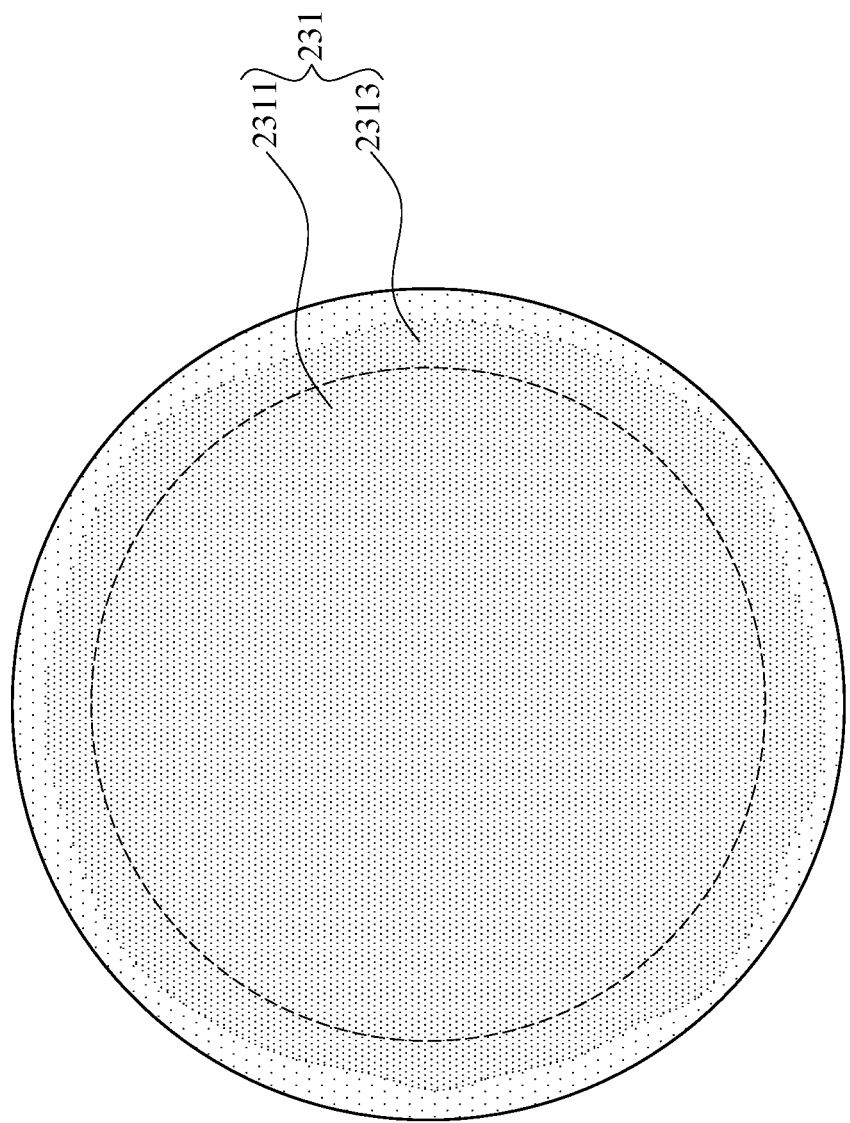
FIG. 9 is a top view illustrating temperature distribution on a carrier of the thin-film-deposition machine, according to another embodiment of the present disclosure.

Next, referring to FIG. 7, FIG. 8 and FIG. 9, wherein FIG. 7 is a cross-sectional view illustrating the thin-film-deposition machine; FIG. 8 is a fragmentary cross-sectional view illustrating an extraction ring and an heat ring of the thin-film-deposition machine; and FIG. 9 is a top view illustrating temperature distribution on a carrier of the thin-film-deposition machine, according to another embodiment of the present disclosure. In another embodiment of the present disclosure, the carrier 23 may be connected to a heater 233, such as a heating coil. The heater 233 is disposed beneath the carrying surface 231 of the carrier 23, for heating the wafer 14 carried by the carrier 23.

As shown in FIG. 7 and FIG. 9, the carrying surface 231 of the carrier 23 may be partitioned into a central region 2311, and an external region 2313 surrounding the central region 2311. The central region 2311 may be round, while the external region 2313 is annular. Commonly, the heater 233 is arranged in a less concentrate manner under the external region 2313, and a relatively higher concentrate manner under the central region 2311. Such that, the heater 233 can only heat the central region 2311 and the external region 2313 in an uneven manner, so as to always transfer heat starting from a radially-internal side then later to a radially-external side of the carrying surface 231, which results in a high heating rate of the central region 2311 and a low heating rate of the external region 2313. Moreover, due to the external region 2313 of the carrying surface 231 is connected to a lateral surface of the carrier 23, which has a relatively large surface area exposed to the containing space 112 and hence easily to have the heat dissipated therefrom, and thus to result in a high temperature of the central region 2311 and a low temperature of the external region 2313.

To improve such drawback, the thin-film-deposition machine 20 is provided with a heat ring 181 (e.g. heating coil) beneath the extraction ring 15. The heat ring 181 is disposed around the carrying surface 231 of the carrier 23, for heating the external region 2313 thereon, so as to even the temperature of the external region 2313 with that of the central region 2311.

As shown in FIG. 7, the chamber 21 may include a counterbore portion 213 disposed at a radially-internal side of the extraction channel 12. The counterbore portion 213 is an annular cavity formed within the containing space 212 of the chamber 21 for engaging with, positioning and supporting the heat ring 181. Also, the extraction ring 15 is disposed above on the heat ring 181. The heat rings 181 formed with different diameters or size may be chosen to mount in the chamber 21, so as to change a gap space between the heat ring 181 and the carrier 23, and thereby to adjust the heating rate of the external region 2313. Also to mention that in this embodiment, the heat ring 181 and the extraction ring 15 are two components contacting each other. However, in a different embodiment, the heat ring 181 may be integrally disposed within the extraction ring 15 as one single component, more specifically, be integrally disposed within the inner flange 159, for example.

As shown in FIG. 7, the chamber 21 may be provided with a linear actuator 135, for driving and moving the carrier 13 toward or away from the dispensing unit 17. As the linear actuator 135 moves the carrier 13 toward the dispensing unit 17, the carrier 13 is positioned to have the lateral surface thereof adjacent to the extraction ring 15, with a tiny gap space therebetween, for example. At this moment, the chamber 21, the carrier 23, the extraction ring 15 and/or the dispensing unit 17 together define a reacting space therebetween within the containing space 212, for performing a thin-film-deposition process to the wafer 14. During the thin-film-deposition process, the heat ring 181 is outside of the reacting space and isolated from the extraction path of the gas or precursor.

As shown in FIG. 9, by virtue of the heat ring 181 beneath the extraction ring 15, the thin-film-deposition machine 20 is able to improve the heating rate of the external region 2313 on the carrying surface 231, so as to even the temperature of the external region 2313 with that of the central region 2311. For example, when the temperature of the central region 2311 reaches a range between 538° C. (Celsius) and 545° C., the external region 2313 is able to reach a range between 533° C. and 538° C., such that, it is proven to possible to evenly heat the wafer 14 on the carrier 23 and to form an even distribution of temperature thereon, and thereby to form a thin film on the wafer 14 with evenly distributed thickness.

Figure 10:
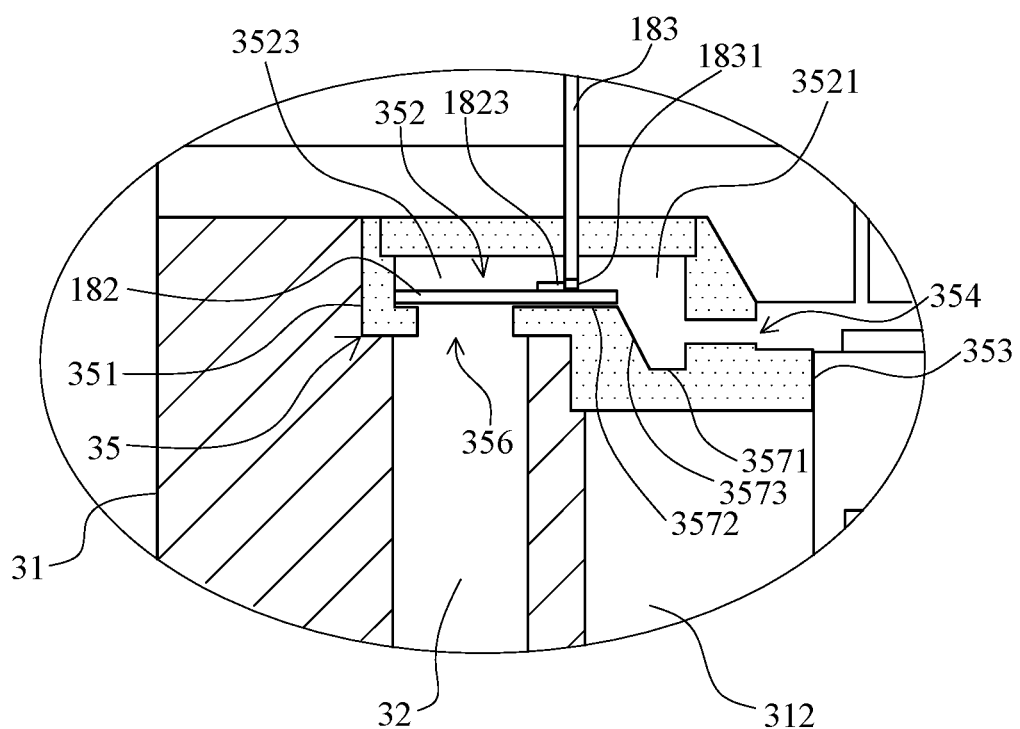
FIG. 10 is a fragmentary cross-sectional view illustrating a ring cover which covers a connecting hole of the extraction ring within the thin-film-deposition machine, according to one embodiment of the present disclosure.
Figure 11:
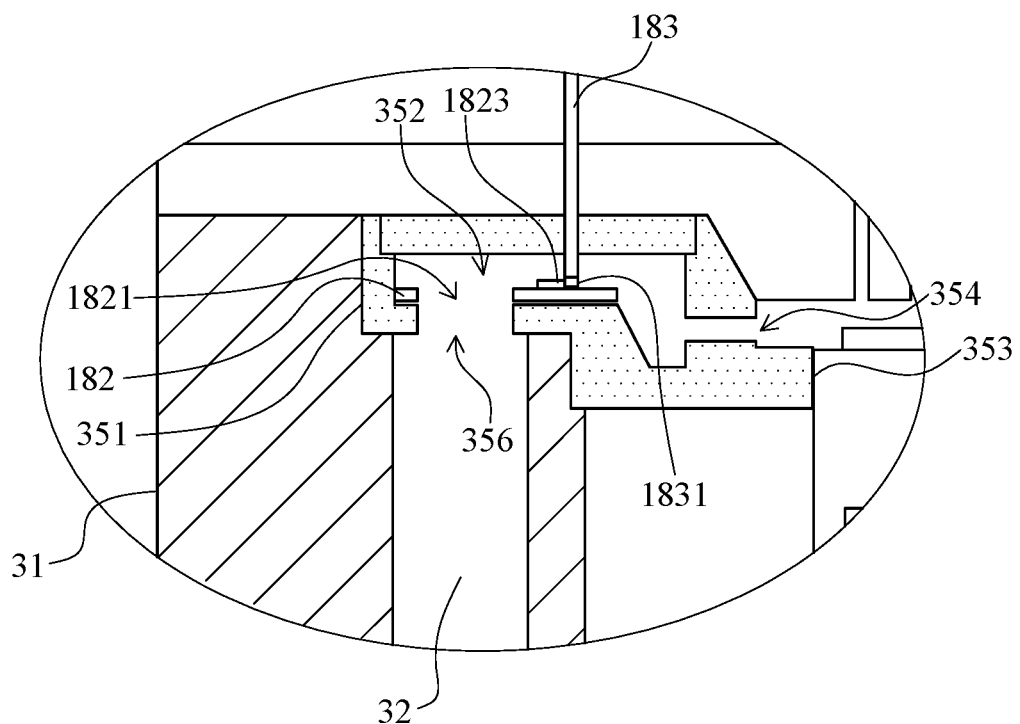
FIG. 11 is a fragmentary cross-sectional view illustrating the ring cover which permits the connecting hole to open within the thin-film-deposition machine, according to one embodiment of the present disclosure.
Figure 12:
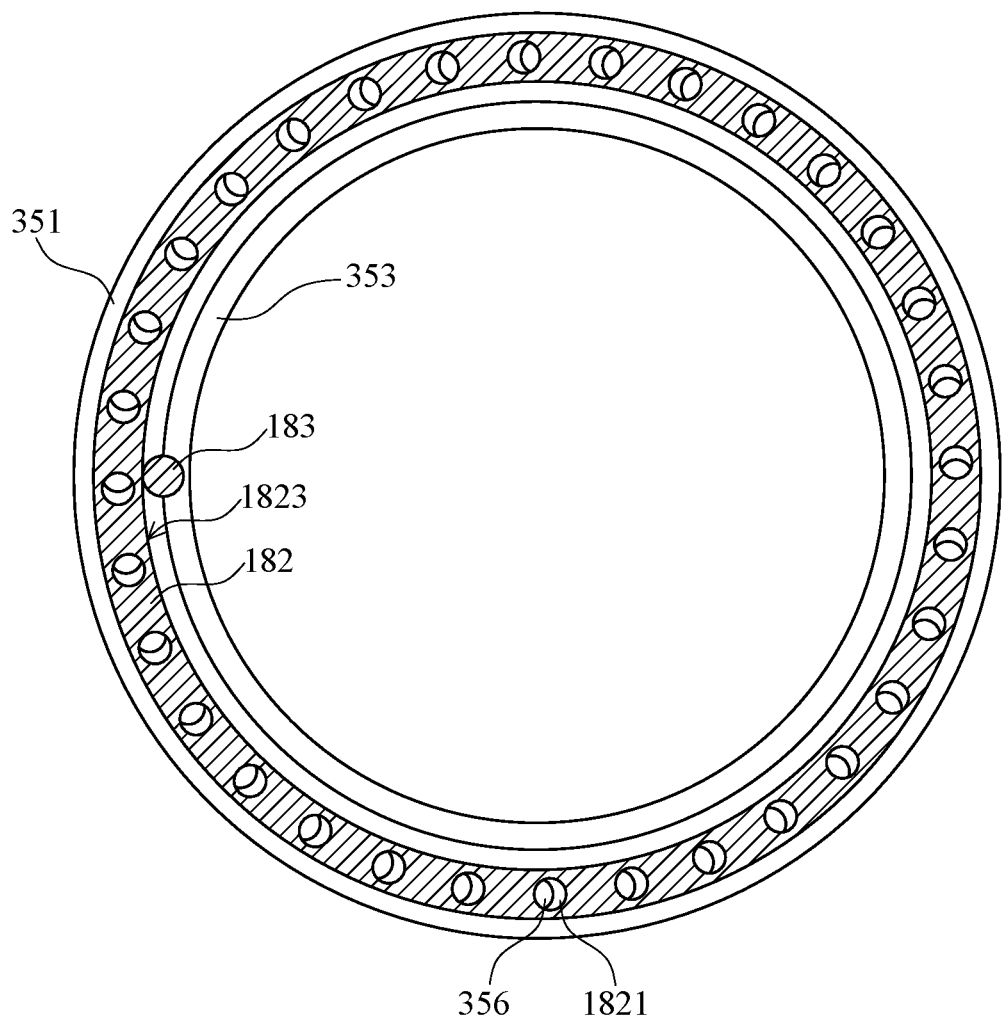
FIG. 12 is a top cross-sectional view illustrating the ring cover within the extraction ring of the thin-film-deposition machine, according to one embodiment of the present disclosure.

For more, referring to FIG. 10, FIG. 11 and FIG. 12, wherein FIG. 10 is a fragmentary cross-sectional view illustrating an ring cover which covers the connecting hole within the thin-film-deposition machine; FIG. 11 is a fragmentary cross-sectional view illustrating the ring cover which permits the connecting hole to open within the thin-film-deposition machine; and FIG. 12 is a top cross-sectional view illustrating the ring cover within the extraction ring of the thin-film-deposition machine, according to one embodiment of the present disclosure. As shown in the FIGs, in one embodiment of the present disclosure, the ring channel 352 of the extraction ring 35 may be partitioned into a first annular space 3521 and a second annular channel 3523. The first annular space 3521 is fluidly connected to the containing space 312 of the chamber 31, while the second annular space 3523 surrounds the first annular space 3521 and be fluidly connected to the extraction channel 32 via the connecting holes 356. Furthermore, the first annular space 3521 is formed with a height greater than that of the second annular space 3523. Within the ring channel 352, a bottom surface 3571 below the first annular space 3521 and a bottom surface 3572 below the second annular space 3523 are connected via an annular-inclined surface 3573, for guiding and facilitating the residual, unused gas or precursor to flow through the ring channel 352 and enter the extraction channel 32.

In one embodiment of the present disclosure, the extraction ring 35 may be provided with a ring cover 182 within the ring channel 352. The ring cover 182 is disposed on the bottom surface 3572, for covering the connecting holes 356. The ring cover 182 is provided with a plurality of openings 1821, wherein a number of the openings 1821 may be equal to that of the connecting holes 356 of the extraction ring 35.

Furthermore, the extraction ring 35 may be provided with a drive rod 183 connected to the ring cover 182, for driving the ring cover 182 to rotate with respect to the extraction ring 35. The ring cover 182 may be connected to the extraction ring 35 via a bearing and further provided with a passive-transmission unit 1823, thereto, the drive rod 183 may be provided with an active-transmission unit 1831. The active-transmission unit 1831 may be a gear or chain, while the active-transmission unit 1831 may be a tooth rack, gear or chain. As the drive rod 183 be driven by a motor (not shown) to rotate, the ring cover 182 is driven to rotate with the drive rod 183 in respect of the extraction ring 35, so as to adjust the coverage of the ring cover 182 on the connecting holes 356, in order to control a flow rate of the gas or precursor from the extraction holes 354 to the connecting holes 356. To be more specific, when the ring cover 182 has the openings 1821 fully aligned with the connecting holes 356 of the extraction ring 35, the connecting holes 356 are fully opened to permit maximum flow rate of the gas or precursor therethrough; and in an opposite manner, the more the openings 1821 are turned away from the connecting holes 356, the less the flow rate may be. In practical use, according to certain requirement or condition of manufacturing process, it is able to adjust the coverage on the connecting holes 356 within the extraction ring 35, in order to control the flow rate on the wafer 14.

Figure 13:
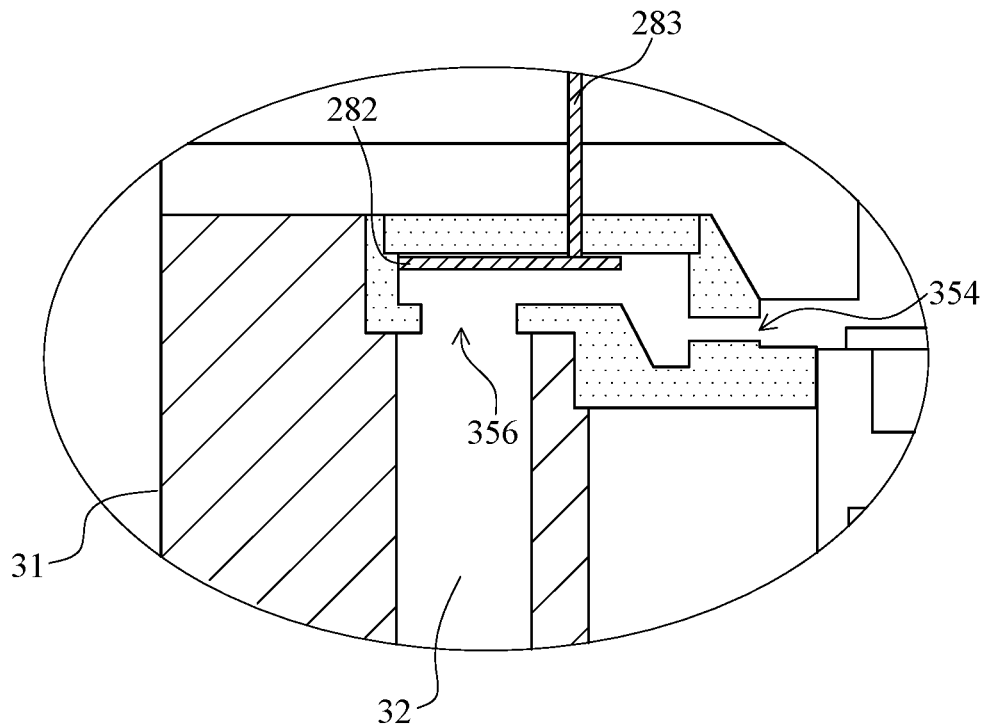
FIG. 13 is a fragmentary cross-sectional view illustrating the ring cover which permits the connecting hole to open within the thin-film-deposition machine, according to one more different embodiment of the present disclosure.
Figure 14:
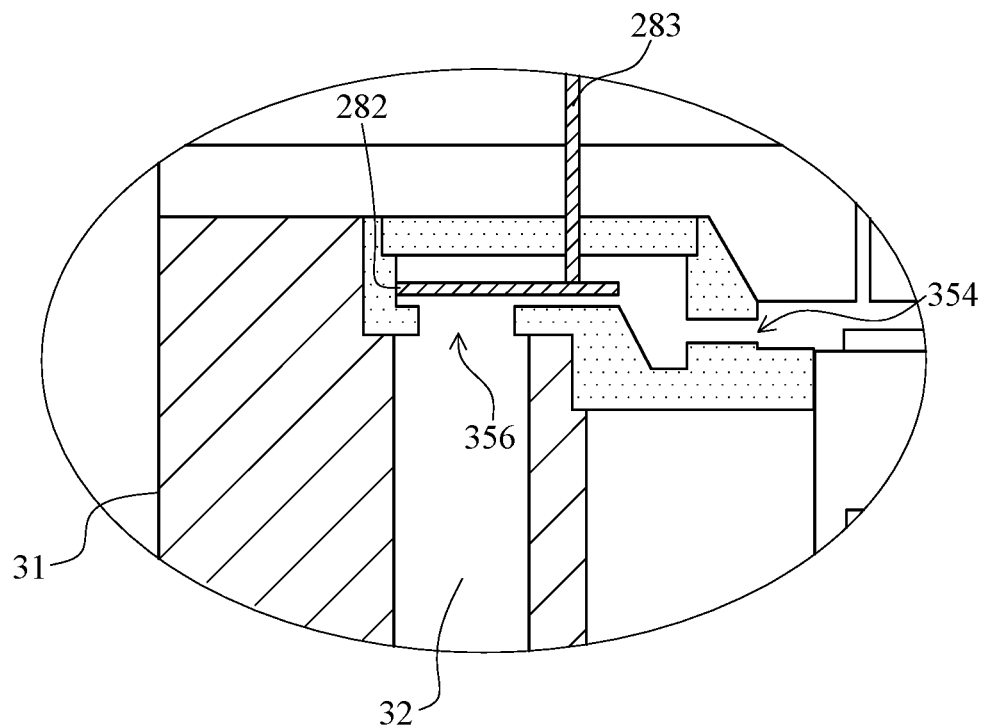
FIG. 14 is a fragmentary cross-sectional view illustrating the ring cover which covers the connecting hole within the thin-film-deposition machine, according to one more different embodiment of the present disclosure.

As shown in FIG. 13 and FIG. 14, in a different embodiment of the present disclosure, the ring cover 282 may be formed completely solid with no opening, and directly connected to the drive rod 283 without transmission unit 1821, 1831. The drive rod 283 may be connected to a piston (not shown). With such a configuration, the drive rod 283 can drive the ring cover 282 to ascend or descend with respect to the connecting holes 356 of the extraction ring 35, so as to change a blockage to the connecting holes 356. To be specific, as the ring cover 282 leaves the connecting holes 356, the flow rate within the extraction hole 354 increases; then in the opposite manner, as the ring cover 282 approaches to block the connecting holes 356, the flow rate decreases.

More to mention, the ring cover 182, 282 and the drive rod 183, 283 are all disposed outside of the containing space 112, where the gas or precursor goes after passing the containing space 112 and the wafer 14 therein. Such that, even when the drive rod 183, 283 drives to turn the ring cover 182, 183 and create certain contaminant particles, due to friction or collision therebetween, the contaminant particles are straightly extracted, flushed out of the extraction channel 12 by the gas-extraction pump 16, without entering to cause contamination to the containing space 112.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition machine, comprising:
    a chamber including a containing space and an extraction channel wherein the extraction channel is disposed around the containing space, the extraction channel includes a first channel area, a second channel area and a third channel area, and the first channel area is formed with a first height shorter than that of a third height of the third channel area; wherein the third channel area is connected to the first channel area via the second area, and the second channel area is formed with a second height which is in a range between the first height and the third height, and the second height is shorter at a side corresponding to the first channel area and greater at a side corresponding to the third channel area;
    a carrier disposed within the containing space and including a carrying surface for carrying at least one wafer;
    an extraction ring including:
        an annular-external wall;
        an annular-internal wall disposed at a radially-internal side of the annular-external wall to surround the carrier, and provided with a plurality of extraction holes; wherein the annular-external wall and the annular-internal wall together define a ring channel therebetween, the ring channel is fluidly connected to the extraction channel of the chamber, and the extraction holes are disposed around the carrying surface of the carrier to fluidly interconnects the containing space and the ring channel; and
    a plurality of the connecting holes interconnecting the ring channel of the extraction ring and the extraction channel of the chamber; wherein the connecting holes above the first channel area are disposed with a distribution density greater than that of the connecting holes above the third channel area, or each of the connecting holes above the first channel area is formed with a diameter larger than that of each of the connecting holes above the third channel area; and
    a dispensing unit including a dispensing surface facing the carrying surface of the carrier, and provided with a plurality of inlet holes fluidly connected to the containing space of the chamber.

2. The thin-film-deposition machine according to claim 1, further comprising a gas-extraction pump connected to the third channel area of the extraction channel; wherein the chamber includes a wafer passage connected to the containing space and disposed beneath the first channel area.

3. The thin-film-deposition machine according to claim 1, wherein the extraction holes of the extraction ring are positioned higher than the carrying surface of the carrier is positioned.

4. The thin-film-deposition machine according to claim 1, further comprising a transfer pipe fluidly connected to the dispensing unit; wherein the transfer pipe includes a transfer space and a guide unit, the guide unit is disposed within the transfer space to partition the transfer space into a first transfer space and a second transfer space, the second transfer space is connected to the dispensing unit, and the guide unit includes a plurality of through holes interconnecting the first transfer space and the second transfer space.

5. The thin-film-deposition machine according to claim 4, wherein the guide unit is provided with a surface facing the first transfer space, the surface facing the first transfer space is provided with a protrusion, and the through holes are disposed around the protrusion and in an inclined manner with respect to the surface facing the first transfer space.

6. The thin-film-deposition machine according to claim 1, wherein the extraction ring includes a first annular bevel formed on the a radially-internal side of the annular-internal wall, and the first annular bevel inclines with respect to an axis of the carrier to face the dispensing unit; the dispensing unit includes a second annular bevel disposed around the dispensing surface; and the first annular bevel and the second annular bevel have an identical inclined angle, so as to align the dispensing unit with the extraction ring.

7. The thin-film-deposition machine according to claim 1, wherein the extraction holes above the first channel area are disposed with a distribution density greater than that of the extraction holes above the third channel area, or each of the extraction holes above the first channel area formed with a diameter larger than that of each of the extraction holes above the third channel area.

8. The thin-film-deposition machine according to claim 1, wherein the second channel area is disposed with at least one inclined surface or at least one curved surface interconnecting a bottom of the first channel area and a bottom of the third channel area.

9. The thin-film-deposition machine according to claim 1, further comprising:
    a heater connected to the carrier for heating the at least one wafer carried by the carrying surface; and
    a heat ring disposed beneath the extraction ring to surround the carrier.

10. The thin-film-deposition machine according to claim 9, wherein the dispensing unit, the carrier and the extraction ring together define a reacting space within the containing space; the dispensing unit transfers at least one precursor into the reacting space through the inlet holes; the least one precursor is transferred into the extraction channel via the extraction holes and the ring channel; and the heat ring is positioned outside of the reacting space.

11. The thin-film-deposition machine according to claim 10, wherein the extraction holes, the ring channel and the extraction channel together define an extraction path, for extracting the at least one precursor out of the reacting space; and the heat ring is isolated from the extraction path.

12. The thin-film-deposition machine according to claim 9, wherein the heat ring is disposed integrally within the extraction ring.

13. The thin-film-deposition machine according to claim 9, wherein the chamber includes a counterbore portion at a radially-internal side of the extraction channel, for supporting and positioning the heat ring; and the extraction ring is disposed above the heat ring.

14. The thin-film-deposition machine according to claim 1, comprising a drive rod including an active-transmission unit, and a ring cover disposed within the ring channel of the extraction ring; wherein the ring cover includes a passive-transmission unit connected to the active-transmission unit of the drive rod; and when the drive rod rotates the ring cover is driven to rotate therewith, thereby to adjust a coverage of the ring cover on the connecting holes of the extraction ring.

15. The thin-film-deposition machine according to claim 1, comprising a ring cover disposed within the ring channel of the extraction ring, and a drive rod connected to the ring cover; wherein the drive rod drives the ring cover to ascend or descend within the ring with respect to the extraction ring, thereby to adjust a blockage of the ring cover on the connecting holes of the extraction ring.

16. The thin-film-deposition machine according to claim 1, wherein the ring channel of the extraction ring includes a first annular space and a second annular space; the first annular space is disposed at a radially-internal side of the second annular space; and the first annular space is formed with a height greater than that of the second annular space.

17. The thin-film-deposition machine according to claim 16, wherein the first annular space is connected to the containing space of the chamber via the extraction hole; the second annular space is connected to the extraction channel of the chamber via the connecting holes; and the extraction ring includes an annular-inclined surface within the ring channel to interconnect a bottom surface defining the first annular space and a bottom surface defining the second annular space.

18. The thin-film-deposition machine according to claim 1, wherein the extraction ring includes an inner flange protruding from the annular-internal wall and disposed beneath of the extraction holes.

* * * * *